(12) United States Patent
Lee et al.

(10) Patent No.: US 8,187,935 B2
(45) Date of Patent: May 29, 2012

(54) METHOD OF FORMING ACTIVE REGION STRUCTURE

(75) Inventors: Young-Ho Lee, Hwaseong-si (KR); Keon-Soo Kim, Hwaseong-si (KR); Jae-Hwang Sim, Seoul (KR); Jin-Hyun Shin, Suwon-si (KR); Kyung-Hoon Min, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 92 days.

(21) Appl. No.: 12/795,025

(22) Filed: Jun. 7, 2010

(65) Prior Publication Data
US 2011/0092048 A1   Apr. 21, 2011

(30) Foreign Application Priority Data
Oct. 21, 2009   (KR) .................. 10-2009-0100351

(51) Int. Cl.
*H01L 21/8247* (2006.01)
(52) U.S. Cl. ................. 438/258; 257/E21.179
(58) Field of Classification Search .......... 438/257–267; 257/E21.179
See application file for complete search history.

(56) References Cited

U.S. PATENT DOCUMENTS

| | | | | | |
|---|---|---|---|---|---|
| 5,756,385 | A | * | 5/1998 | Yuan et al. | ........... 438/258 |
| 7,550,363 | B2 | | 6/2009 | Lee | |
| 2007/0155124 | A1 | | 7/2007 | Ahn et al. | |

FOREIGN PATENT DOCUMENTS

| | | |
|---|---|---|
| KR | 10-2007-0015762 A | 2/2007 |
| KR | 10-0729911 B1 | 6/2007 |
| KR | 10-2007-0098322 A | 10/2007 |
| KR | 10-2008-0022398 A | 3/2008 |
| KR | 10-0870323 B1 | 11/2008 |

\* cited by examiner

*Primary Examiner* — Richard A. Booth
(74) *Attorney, Agent, or Firm* — Lee & Morse, P.C.

(57) ABSTRACT

A method of forming an active region structure includes preparing a semiconductor substrate having a cell array region and a peripheral circuit region, forming upper cell mask patterns having a line shape in the cell array region, forming first and second peripheral mask patterns in the peripheral circuit region, the first and second peripheral mask patterns being stacked in sequence and covering the peripheral circuit region, and upper surfaces of the upper cell mask patterns forming a step difference with an upper surface of the second peripheral mask pattern, forming spacers on sidewalls of the upper cell mask patterns to expose lower portions of the upper cell mask patterns and the second peripheral mask pattern, and removing the lower portions of the upper cell mask patterns using the spacers and the first and second peripheral mask patterns as an etch mask.

9 Claims, 13 Drawing Sheets

METHOD OF FORMING ACTIVE REGION STRUCTURE

BACKGROUND

1. Field

Example embodiments relate to a method of forming an active region structure.

2. Description of Related Art

In general, a semiconductor device is fabricated to have a trench and a device isolation layer in a semiconductor substrate in order to limit active regions in the semiconductor substrate. The trench defines the active regions and is filled with the device isolation layer. The device isolation layer may securely insulate the active regions, as compared with an impurity diffusion region in the semiconductor substrate. However, with a reduction in the design rule of semiconductor devices, the dimensions of active regions are continuously decreasing. Thus, the dimensions of the active regions may approach the dimensions of the discrete elements disposed on the semiconductor substrate. As a result, the dimension of the trench may approach a limit of a semiconductor photolithography process and of a semiconductor etching process in the semiconductor substrate.

SUMMARY

Embodiments are therefore directed to a method of forming an active region structure, which substantially overcomes one or more of the problems due to the limitations and disadvantages of the related art.

Embodiments provide a method of forming an active region structure that can overcome a limit of a semiconductor photolithography process and of a semiconductor etching process.

At least one of embodiments may be realized by providing a method of forming an active region structure. The method includes preparing a semiconductor substrate. The semiconductor substrate has a cell array region and a peripheral circuit region. Upper cell mask patterns are formed in the cell array region, and first and second peripheral mask patterns are formed in the peripheral circuit region. The upper cell mask patterns have a line shape. The first and second peripheral mask patterns are stacked in sequence and cover the peripheral circuit region. Upper surfaces of the upper cell mask patterns form a step difference with an upper surface of the second peripheral mask pattern. Spacers are formed on sidewalls of the upper cell mask patterns. The spacers are formed to expose lower portions of the upper cell mask patterns and the second peripheral mask pattern. Using the spacers and the first and second peripheral mask patterns as an etch mask, the lower portions of the upper cell mask patterns are removed.

In example embodiments, forming the upper cell mask patterns and the first and second peripheral mask patterns may include sequentially forming an upper mask layer and photoresist patterns on the semiconductor substrate. The photoresist patterns in the cell array region may expose the upper mask layer in the cell array region. The photoresist pattern in the peripheral circuit region may cover the upper mask layer in the peripheral circuit region. The upper mask layer may be formed of a stacked material. An upper portion of the upper mask layer may be etched using the photoresist patterns as an etch mask. The photoresist patterns may be removed from the semiconductor substrate. A lower portion of the upper mask layer in the cell array region may be etched using the upper portion of the upper mask layer in the cell array region and the upper mask layer in the peripheral circuit region as an etch mask. The upper mask layer may be formed into the upper cell mask patterns in the cell array region and the first and second peripheral mask patterns in the peripheral circuit region. The upper surfaces of the upper cell mask patterns may have a lower level than the upper surface of the second peripheral mask pattern due to an etch loading effect of an etching gas after the photoresist patterns are removed.

In example embodiments, forming the spacers may include forming a spacer layer on the upper cell mask patterns and the first and second peripheral mask patterns. Using the second peripheral mask pattern as an etch buffer layer, the spacer layer, and the upper portions of the upper cell mask patterns may be etched.

In example embodiments, the method may further include forming a lower mask layer between the semiconductor substrate and the upper mask layer. Using the spacers and the first and second peripheral mask patterns as an etch mask, the lower mask layer in the cell array region may be partially etched. The second peripheral mask pattern may be removed from the semiconductor substrate, and the lower mask layer may be formed of a stacked material. An upper portion of the lower mask layer in the cell array region may have a line shape corresponding to the spacers. Using the spacers and the lower mask layer as an etch buffer layer, the first peripheral mask pattern may be removed. Using the spacers, the upper portion of the lower mask layer in the cell array region, and the lower mask layer in the peripheral circuit region as an etch mask, a lower portion of the lower mask layer in the cell array region may be etched. The lower mask layer may be formed into lower cell mask patterns in the cell array region through the spacers and third and fourth peripheral mask patterns stacked in sequence in the peripheral circuit region. And, the spacers may be removed from the semiconductor substrate after the lower cell mask patterns and the third and fourth peripheral mask patterns are formed.

In example embodiments, the method may further include sequentially forming a tunnel oxide layer and a floating poly layer between the semiconductor substrate and the lower mask layer. Using the lower cell mask patterns and the third and fourth peripheral mask patterns as an etch mask, the floating poly layer in the cell array region may be etched. Upper portions of the lower cell mask patterns and the fourth peripheral mask pattern may be removed from the semiconductor substrate. The floating poly layer may be formed into cell floating poly patterns in the cell array region and a peripheral floating poly pattern in the peripheral circuit region. Using lower portions of the lower cell mask patterns, the cell floating poly patterns, the third peripheral mask pattern and the peripheral floating poly pattern as an etch mask, the tunnel oxide layer and the semiconductor substrate in the cell array region may be etched. Through the etching of this process, the cell array region may have cell trenches in the semiconductor substrate. After the cell trenches are formed, the tunnel oxide layer may be formed into cell tunnel oxide patterns in the cell array region and a peripheral tunnel oxide pattern in the peripheral circuit region.

In example embodiments, the method may further include forming a first insulating layer on the lower portions of the lower cell mask patterns and the third peripheral mask pattern to fill the cell trenches. The semiconductor substrate, the peripheral tunnel oxide pattern, the peripheral floating poly pattern, the third peripheral mask pattern and the first insulating layer in the peripheral circuit region may be etched. Through the etching of this process, the peripheral circuit region may have at least one cell trench in the semiconductor substrate. A second insulating layer may be formed on the first insulating layer to fill the at least one peripheral trench.

The first insulating layer may include insulating material having fluidity. The second insulating layer may include insulating material having a higher mechanical strength than the first insulating layer.

In example embodiments, forming the at least one peripheral trench may include forming a photoresist layer on the first insulating layer. The photoresist layer may have at least one opening in the peripheral circuit region. Through the at least one opening of the photoresist layer, the semiconductor substrate, the peripheral tunnel oxide pattern, the peripheral floating poly pattern, the third peripheral mask pattern and the first insulating layer in the peripheral circuit region may be etched. A light source of semiconductor photolithography equipment corresponding to the photoresist layer may have one selected from the same frequency as, and a different frequency than a light source of semiconductor photolithography equipment corresponding to the photoresist patterns.

In example embodiments, the method may further include a first insulating layer on the lower portions of the lower cell mask patterns to fill the cell trenches, and on the third peripheral mask pattern. The first insulating layer, the lower portions of the lower cell mask patterns and the third peripheral mask pattern may be etched to expose the cell floating poly patterns and the peripheral floating poly pattern, and a cell device isolation layer may be formed. The cell device isolation layer may be formed in the cell trenches. By etching the semiconductor substrate, the peripheral tunnel oxide pattern and the peripheral floating poly pattern in the peripheral circuit region, at least one peripheral trench may be formed in the peripheral circuit region. A second insulating layer may be formed on the cell device isolation layer, the cell floating poly patterns and the peripheral floating poly pattern to fill the at least one peripheral trench. The first insulating layer may include insulating material having fluidity. The second insulating layer may include insulating material having a higher mechanical strength than the first insulating layer.

In example embodiments, forming the at least one peripheral trench may include forming a photoresist layer on the cell device isolation layer, the cell floating poly patterns and the peripheral floating poly pattern. The photoresist layer may have at least one opening in the peripheral circuit region. Through the at least one opening of the photoresist layer, the semiconductor substrate, the peripheral tunnel oxide pattern and the peripheral floating poly pattern in the peripheral circuit region may be etched. A light source of semiconductor photolithography equipment corresponding to the photoresist layer may have one selected from the same frequency as, and a different frequency than a light source of semiconductor photolithography equipment corresponding to the photoresist patterns.

In example embodiments, the lower mask layer may include silicon dioxide ($SiO_2$) in the lower portion and polysilicon in the upper portion. The upper mask layer may include polymer in the lower portion and anti-reflective coating (ARC) material in the upper portion.

At least one of embodiments may also be realized by providing a method of forming an active region structure. The method includes sequentially forming a tunnel oxide layer and a floating poly layer on a semiconductor substrate. The semiconductor substrate has a cell array region and a peripheral circuit region. By etching the semiconductor substrate, the tunnel oxide layer and the floating poly layer in the peripheral circuit region, at least one peripheral trench is formed in the peripheral circuit region. To expose the floating poly layer in the cell array region and the peripheral circuit region, a peripheral device isolation layer is formed in the at least one peripheral trench. Lower and upper mask layers are formed in sequence on the floating poly layer in the cell array region and the peripheral circuit region to cover the peripheral device isolation layer. Each of the lower and upper mask layers is formed of a stacked material.

In example embodiments, the method may further include forming upper cell mask patterns in the cell array region, and first and second peripheral mask patterns in the peripheral circuit region by etching the upper mask layer. The upper cell mask patterns may have a line shape. The first and second peripheral mask patterns may be stacked in sequence and cover the peripheral circuit region. Upper surfaces of the upper cell mask patterns may form a step difference with an upper surface of the second peripheral mask pattern. Spacers may be formed on sidewalls of the upper cell mask patterns. The spacers may be formed to expose lower portions of the upper cell mask patterns, and the second peripheral mask pattern. Using the spacers and the first and second peripheral mask patterns as an etch mask, the lower portions of the upper cell mask patterns may be removed.

In example embodiments, forming the spacers may include forming a spacer layer on the upper cell mask patterns and the first and second peripheral mask patterns. Using the second peripheral mask pattern as an etch buffer layer, the spacer layer, and upper portions of the upper cell mask patterns may be etched.

In example embodiments, the method may further include partially etching the lower mask layer in the cell array region using the spacers and the first and second peripheral mask patterns as an etch mask. The second peripheral mask pattern may be removed from the semiconductor substrate. An upper portion of the lower mask layer in the cell array region may have a line shape corresponding to the spacers. Using the spacers and the lower mask layer as an etch buffer layer, the first peripheral mask pattern may be removed. Using the spacers, the upper portion of the lower mask layer in the cell array region, and the lower mask layer in the peripheral circuit region as an etch mask, a lower portion of the lower mask layer in the cell array region may be etched. The lower mask layer may be formed into lower cell mask patterns in the cell array region through the spacers and third and fourth peripheral mask patterns stacked in sequence in the peripheral circuit region. And, the spacers may be removed from the semiconductor substrate after the lower cell mask patterns and the third and fourth peripheral mask patterns are formed.

In example embodiments, the method may further include etching the floating poly layer in the cell array region using the lower cell mask patterns and the third and fourth peripheral mask patterns as an etch mask. Upper portions of the lower cell mask patterns and the fourth peripheral mask pattern may be removed from the semiconductor substrate. The floating poly layer may be formed into cell floating poly patterns in the cell array region and a peripheral floating poly pattern in the peripheral circuit region. Using lower portions of the lower cell mask patterns, the cell floating poly patterns, the third peripheral mask pattern and the peripheral floating poly pattern as an etch mask, the tunnel oxide layer and the semiconductor substrate in the cell array region may be etched. Through the etching of this process, the cell array region may have cell trenches in the semiconductor substrate. A first insulating layer may be formed on the lower portions of the lower cell mask patterns to fill the cell trenches, and on the third peripheral mask pattern. After the cell trenches are formed, the tunnel oxide layer may be formed into cell tunnel oxide patterns in the cell array region and a peripheral tunnel oxide pattern in the peripheral circuit region.

At least one of embodiments may also be realized by providing a method of forming an active region structure. The method includes sequentially forming a tunnel oxide layer and a floating poly layer on a semiconductor substrate. The semiconductor substrate has a cell array region and a peripheral circuit region. By etching the semiconductor substrate, the tunnel oxide layer and the floating poly layer in the peripheral circuit region, at least one peripheral trench is formed in the peripheral circuit region. Lower and upper mask layers are formed in sequence on the floating poly layer in the cell array region and the peripheral circuit region to fill the at least one peripheral trench. Each of the lower and upper mask layers is formed of a stacked material. A lower portion of the lower mask layer has one selected from a shape conformally covering the at least one peripheral trench and a shape filling the at least one peripheral trench.

In example embodiments, the method may further include forming upper cell mask patterns in the cell array region, and first and second peripheral mask patterns in the peripheral circuit region by etching the upper mask layer. The upper cell mask patterns may have a line shape. The first and second peripheral mask patterns may be stacked in sequence and cover the peripheral circuit region. Upper surfaces of the upper cell mask patterns may form a step difference with an upper surface of the second peripheral mask pattern. Spacers may be formed on sidewalls of the upper cell mask patterns. The spacers may be formed to expose lower portions of the upper cell mask patterns, and the second peripheral mask pattern. Using the spacers and the first and second peripheral mask patterns as an etch mask, the lower portions of the upper cell mask patterns may be removed.

In example embodiments, forming the spacers may include forming a spacer layer on the upper cell mask patterns and the first and second peripheral mask patterns. Using the second peripheral mask pattern as an etch buffer layer, the spacer layer, and upper portions of the upper cell mask patterns may be etched.

In example embodiments, the method may further include partially etching the lower mask layer in the cell array region using the spacers and the first and second peripheral mask patterns as an etch mask. The second peripheral mask pattern may be removed from the semiconductor substrate. An upper portion of the lower mask layer in the cell array region may have a line shape corresponding to the spacers. Using the spacers and the lower mask layer as an etch buffer layer, the first peripheral mask pattern may be removed. Using the spacers, the upper portion of the lower mask layer in the cell array region, and the lower mask layer in the peripheral circuit region as an etch mask, the lower portion of the lower mask layer in the cell array region may be etched. The lower mask layer may be formed into lower cell mask patterns in the cell array region through the spacers and third and fourth peripheral mask patterns stacked in sequence in the peripheral circuit region. And, the spacers may be removed from the semiconductor substrate after the lower cell mask patterns and the third and fourth peripheral mask patterns are formed.

In example embodiments, the method may further include etching the floating poly layer in the cell array region using the lower cell mask patterns and the third and fourth peripheral mask patterns as an etch mask. Upper portions of the lower cell mask patterns and the fourth peripheral mask pattern may be removed from the semiconductor substrate. The floating poly layer may be formed into cell floating poly patterns in the cell array region and a peripheral floating poly pattern in the peripheral circuit region. Using lower portions of the lower cell mask patterns, the cell floating poly patterns, the third peripheral mask pattern and the peripheral floating poly pattern as an etch mask, the tunnel oxide layer and the semiconductor substrate in the cell array region may be etched. Through the etching of this process, the cell array region may have cell trenches in the semiconductor substrate. A first insulating layer may be formed on the lower portions of the lower cell mask patterns to fill the cell trenches, and on the third peripheral mask pattern. After the cell trenches are formed, the tunnel oxide layer may be formed into cell tunnel oxide patterns in the cell array region and a peripheral tunnel oxide pattern in the peripheral circuit region.

BRIEF DESCRIPTION OF THE DRAWINGS

Embodiments will become more apparent to those of ordinary skill in the art by describing in detail with reference to the attached drawings, in which.

DETAILED DESCRIPTION OF THE EMBODIMENTS

Figure 1:
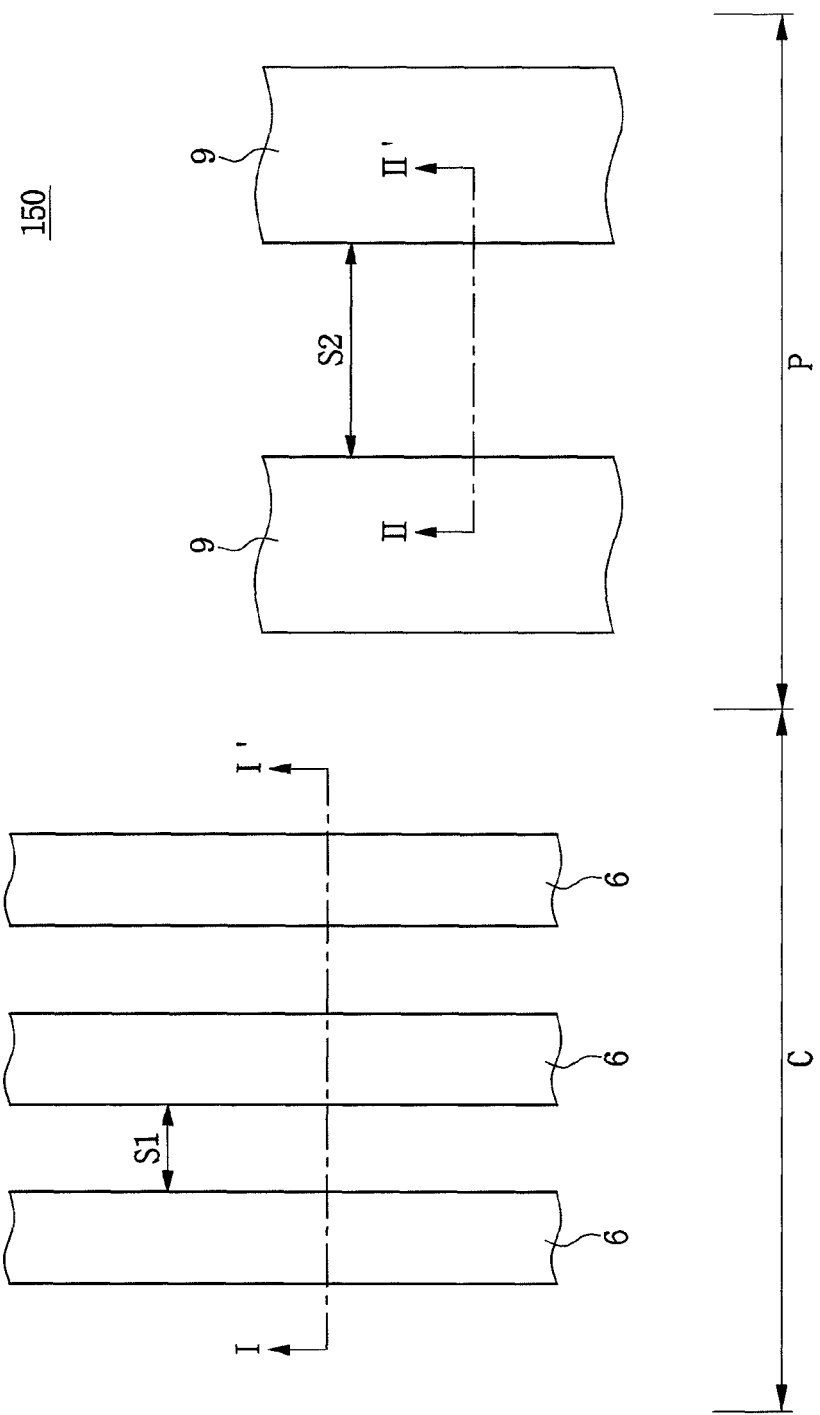
FIG. 1 illustrates a plan view of an active region structure according to example embodiments.

Korean Patent Application No. 10-2009-0100351, filed on Oct. 21, 2009, in the Korean Intellectual Property Office, and entitled: "Method of Forming Active Region Structure," is incorporated by reference herein in its entirety.

Various example embodiments will now be described more fully with reference to the accompanying drawings in which some example embodiments are shown. In the drawings, the thicknesses and other dimensions of layers and regions may be exaggerated for clarity.

Detailed illustrative embodiments are disclosed herein. However, specific structural and functional details disclosed herein are merely representative for purposes of describing example embodiments. This inventive concept, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the inventive concept. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," "on" versus "directly on," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the inventive concept is not limited to example embodiments described.

A method of forming an active region structure will be described with reference to FIGS. 1 to 13.

FIG. 1 illustrates a plan view of an active region structure according to example embodiments.

Referring to FIG. 1, an active region structure 150 according to example embodiments may include a cell array region C and a peripheral circuit region P. The cell array region C may be surrounded by the peripheral circuit region P. The peripheral circuit region P may be disposed around the cell array region C. Cell active regions 6 may be disposed in the cell array region C. The cell active regions 6 may be arranged at predetermined intervals S1 in the cell array region C.

The cell active regions 6 of the cell array region C may have a line shape. The cell active regions 6 of the cell array region C may have a shape other than the line shape. Meanwhile, the peripheral circuit region P may have peripheral active regions 9. The peripheral active regions 9 may be spaced apart from each other by a predetermined distance S2. The peripheral active regions 9 may have various shapes according to a requirement of design.

FIGS. 2 to 7 illustrate cross-sectional views of stages in a method of forming an active region structure along lines I-I' and II-II' of FIG. 1.

Figure 2:
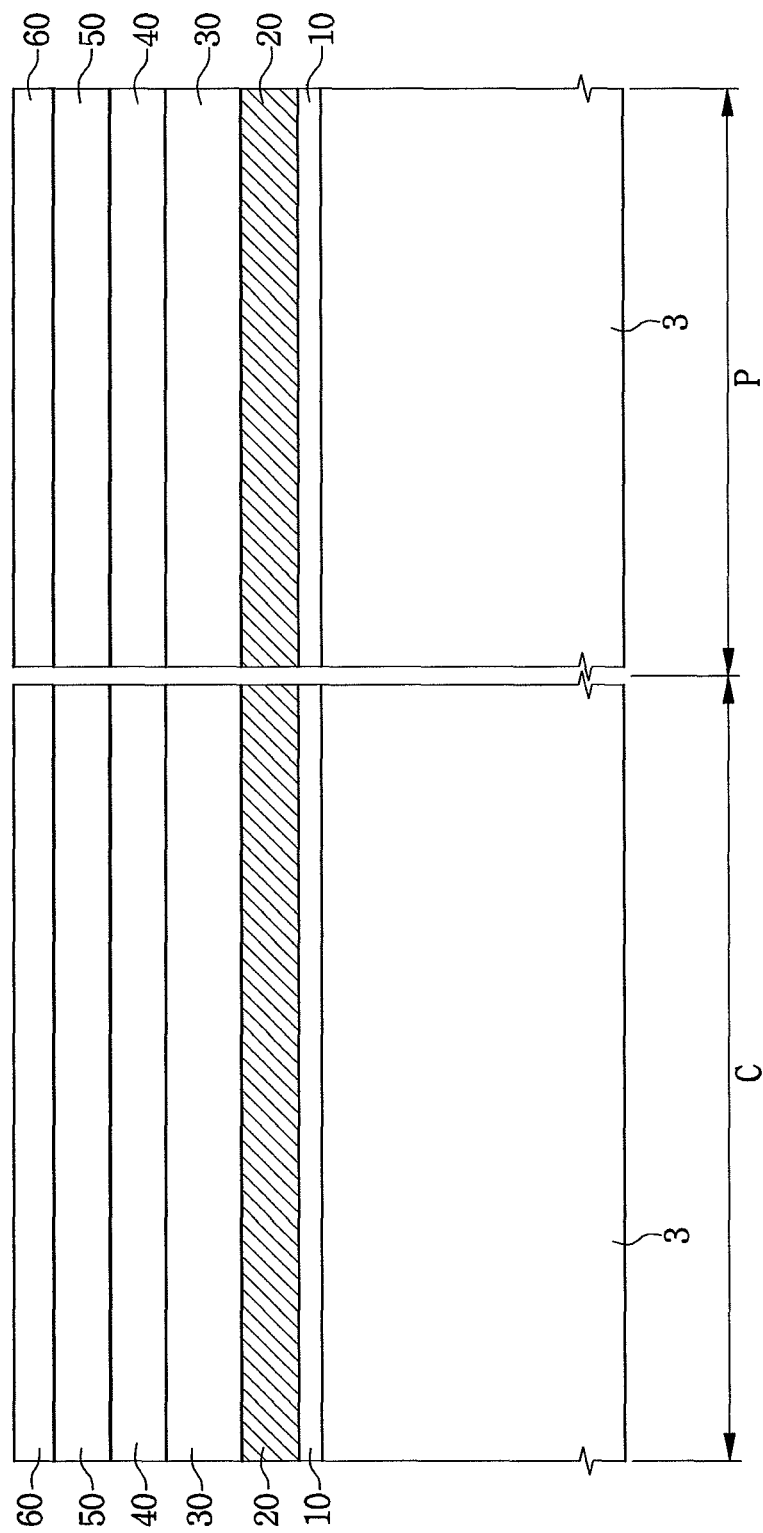
FIGS. 2 to 7 illustrate cross-sectional views of stages in a method of forming an active region structure along lines I-I' and II-IF of FIG. 1.

Referring to FIG. 2, a semiconductor substrate 3 may be prepared according to example embodiments. The semiconductor substrate 3 may have the cell array region C and the peripheral circuit region P. A tunnel oxide layer 10 and a floating poly layer 20 may be formed on the semiconductor substrate 3. The tunnel oxide layer 10 and the floating poly layer 20 may be formed to cover the cell array region C and the peripheral circuit region P. The tunnel oxide layer 10 may have the same dielectric constant as, or a higher dielectric constant than a silicon dioxide ($SiO_2$) layer.

The floating poly layer 20 may be a conductive layer having impurity ions. A first mask layer 30 and a second mask layer 40 may be formed on the floating poly layer 20. The first and second mask layers 30 and 40 may be formed to cover the cell array region C and the peripheral circuit region P. The first mask layer 30 may include, e.g., $SiO_2$. The second mask layer 40 may include, e.g., polysilicon. The second mask layer 40 may or may not be doped with impurity ions.

A third mask layer 50 and a fourth mask layer 60 may be formed on the second mask layer 40. The third and fourth mask layers 50 and 60 may be formed to cover the cell array region C and the peripheral circuit region P. The third mask layer 50 may include, e.g., a polymer. The fourth mask layer 60 may include anti-reflective coating (ARC) material.

Figure 3:
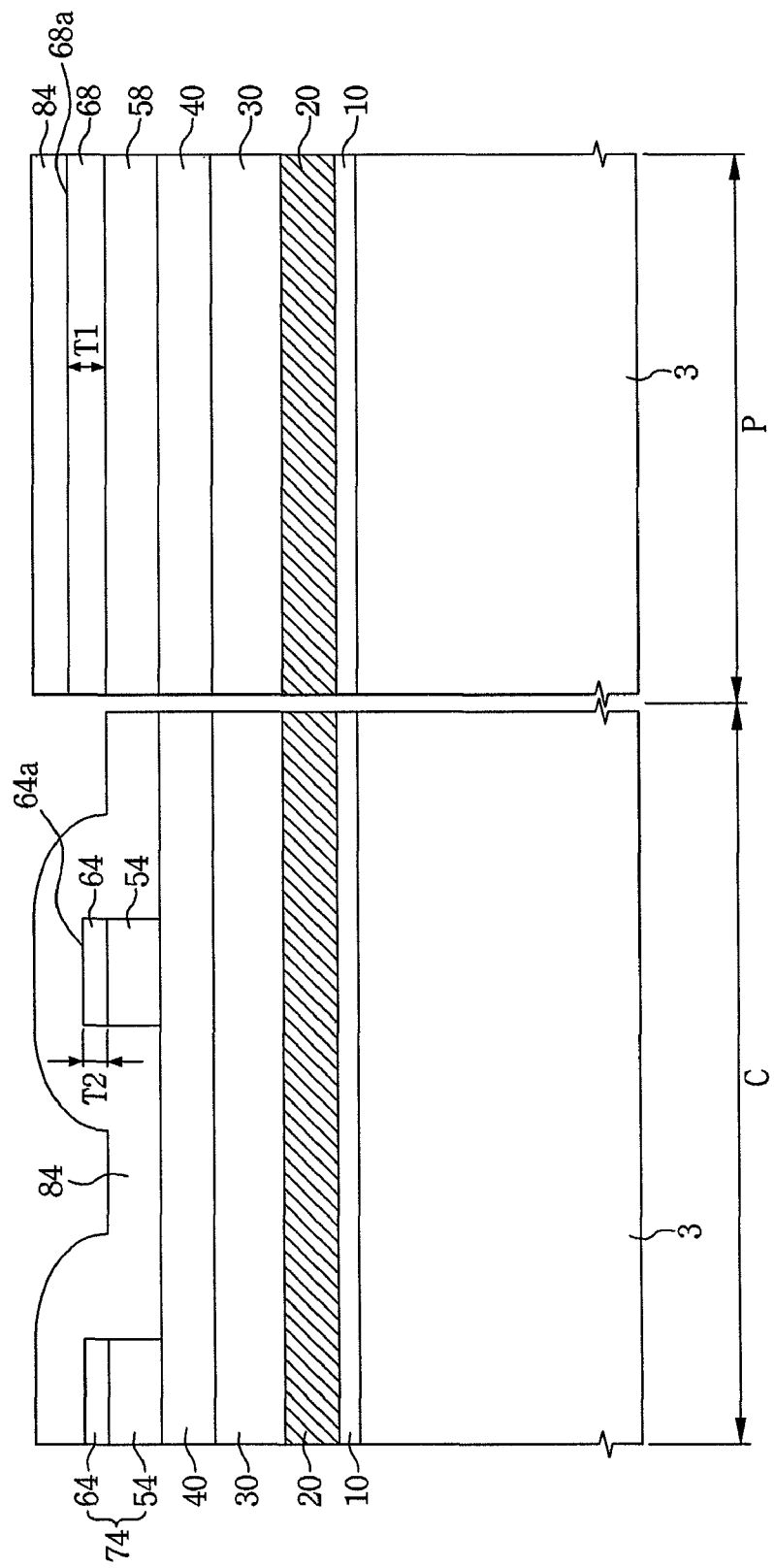

Referring to FIG. 3, photoresist patterns (not shown) may be formed on the fourth mask layer 60 according to example embodiments. The photoresist patterns in the cell array region C may expose the fourth mask layer 60 in the cell array region C. The photoresist patterns in the peripheral circuit region P may, e.g., completely, cover the fourth mask layer 60 in the peripheral circuit region P. Using the photoresist patterns as an etch mask, the fourth mask layer 60 may be etched.

The fourth mask layer 60 may be formed into fourth cell mask patterns 64 corresponding to the photoresist patterns in the cell array region C and a fourth peripheral mask pattern 68 in the peripheral circuit region P. The fourth cell mask patterns 64 may have a line shape. The fourth peripheral mask pattern 68 may be formed to, e.g., completely, cover the peripheral circuit region P. After the fourth cell mask patterns 64 and the fourth peripheral mask pattern 68 are formed, the photoresist patterns may be removed from the semiconductor substrate 3.

Using the fourth cell mask patterns 64 and the fourth peripheral mask pattern 68 as an etch mask, the third mask layer 50 may be etched. While the third mask layer 50 is etched, the fourth cell mask patterns 64 and the fourth peripheral mask pattern 68 may be subject to an etch loading effect due to an etching gas. In other words, while the etching gas is used to etch the third mask layer 50, the etch loading effect may affect the fourth cell mask patterns 64 and the fourth peripheral mask pattern 68 according to different densities of the patterns in the cell array region C and the peripheral circuit region P.

That is, due to the different densities of the patterns in the cell array region C and the peripheral circuit region P, the etching gas may affect differently the fourth cell mask patterns 64 and the fourth peripheral mask pattern 68. As such, the fourth cell mask patterns 64 and the fourth peripheral mask pattern 68 may have different thicknesses due to the etch loading effect, e.g., may include a polymer layer having different thicknesses on upper surfaces thereof. The different thicknesses, i.e., the polymer layer, may be defined while the third mask layer 50, the fourth cell mask patterns 64, and the fourth peripheral mask pattern 68 are etched. Therefore, upper surfaces 64a of the fourth cell mask patterns 64 may form a step difference with respect to an upper surface 68a of the fourth peripheral mask pattern 68.

That is, the upper surfaces 64a of the fourth cell mask patterns 64 may have a lower level than the upper surface 68a of the fourth peripheral mask pattern 68, i.e., a distance between the upper surfaces 64a to a reference point on the substrate 3 may be shorter than a distance between the upper surface 68a to the reference point on the substrate 3. A thickness T2 of the fourth cell mask patterns 64 may be smaller than a thickness T1 of the fourth peripheral mask pattern 68. In this way, the third mask layer 50 may be formed into third cell mask patterns 54 in the cell array region C and a third peripheral mask pattern 58 in the peripheral circuit region P. The third cell mask patterns 54 and the third peripheral mask pattern 58 may correspond to the fourth cell mask patterns 64 and the fourth peripheral mask pattern 68.

The third cell mask patterns 54 and the fourth cell mask patterns 64 thereon may define upper cell mask patterns 74 in the cell array region C. Subsequently, a spacer layer 84 may be formed to cover, e.g., conformally, the upper cell mask patterns 74, the third peripheral mask pattern 58, and the fourth peripheral mask pattern 68. The spacer layer 84 may include, e.g., $SiO_2$.

Figure 4:
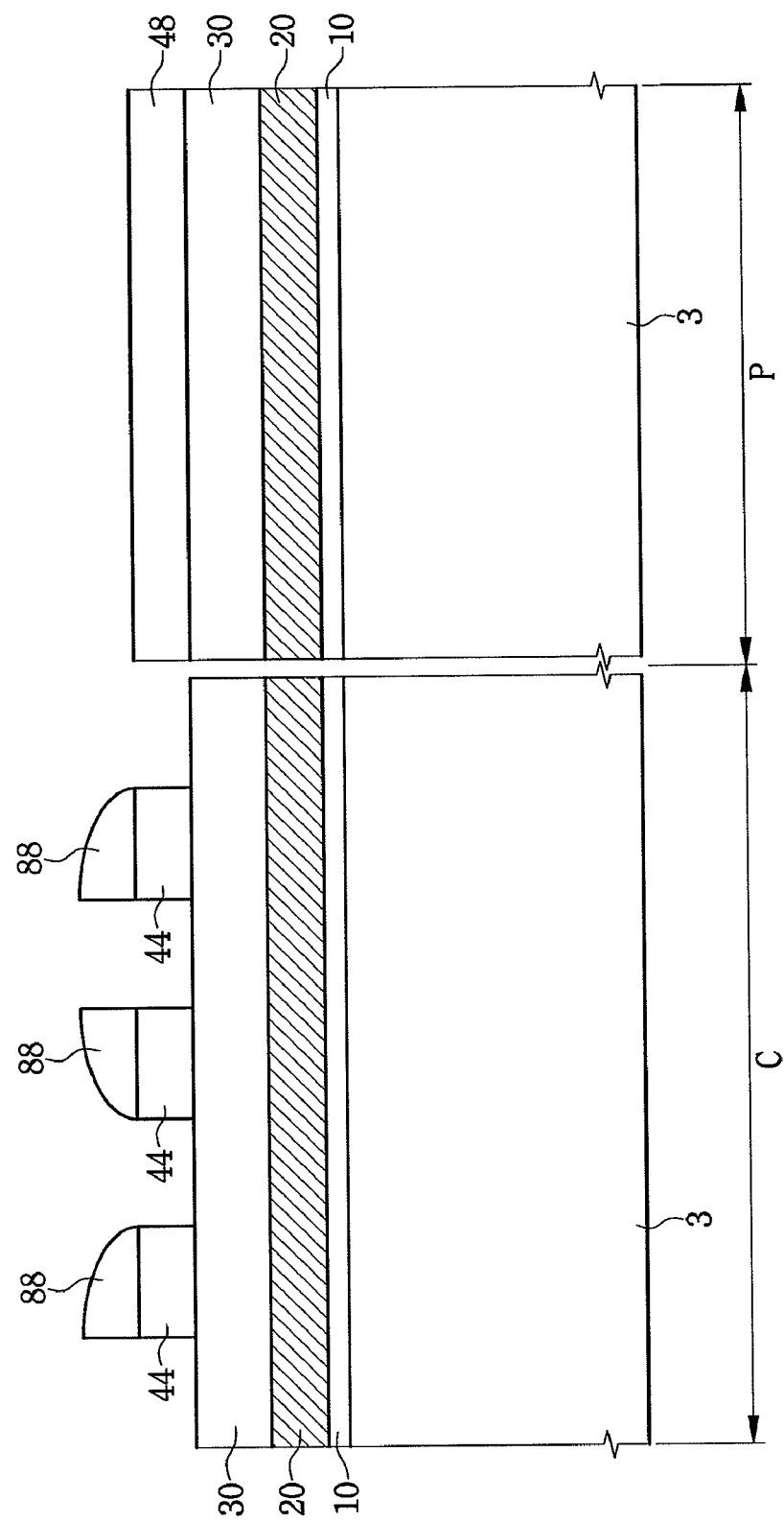

Referring to FIG. 4, using the fourth peripheral mask pattern 68 as an etch buffer layer, the spacer layer 84 and the fourth mask patterns 64 may be etched according to example embodiments, i.e., at least a portion of the spacer layer 84 and the fourth mask patterns 64 may be removed, so a portion of the spacer layer 84 may remain on the third cell mask patterns 54. In other words, the spacer layer 84 may be formed into spacers 88 on the sidewalls of the upper cell mask patterns 74, i.e., on the third cell mask patterns 54. The spacers 88 may be formed to expose the third cell mask patterns 54 and the fourth peripheral mask pattern 68. Using the spacers 88 and the third and fourth peripheral mask patterns 58 and 68 as an etch mask, the third cell mask patterns 54 may be removed.

Using the spacers 88 and the third and fourth peripheral mask patterns 58 and 68 as an etch mask, the second mask layer 40 in the cell array region C may be removed. In this case, the fourth peripheral mask pattern 68 may be removed from the semiconductor substrate 3. The second mask layer 40 may be formed into second cell mask patterns 44 in the cell array region C and a second peripheral mask pattern 48 in the peripheral circuit region P. The second cell mask patterns 44 and the second peripheral mask pattern 48 may correspond to the spacers 88 and the third peripheral mask pattern 58.

The second cell mask patterns 44 may expose the first mask layer 30 in the cell array region C. Subsequently, using the first mask layer 30, the second cell mask patterns 44, the second peripheral mask pattern 48, and the spacers 88 as an etch buffer layer, the third peripheral mask pattern 58 may be removed.

Figure 5:
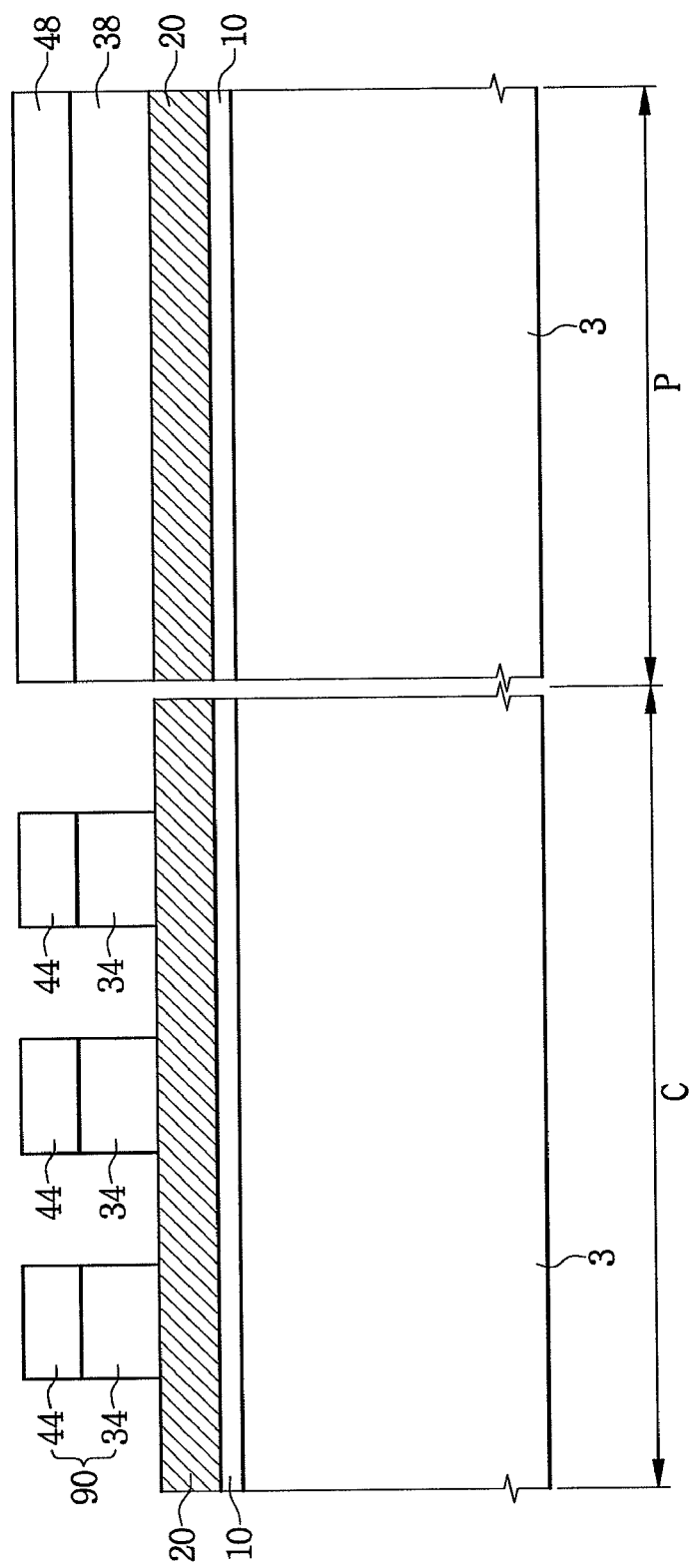

Referring to FIG. 5, using the spacers 88, the second cell mask patterns 44, and the second peripheral mask pattern 48 as an etch mask, the first mask layer 30 in the cell array region C may be etched according to example embodiments. In this case, the spacers 88 may be removed from the semiconductor substrate 3. The first mask layer 30 may be formed into first cell mask patterns 34 in the cell array region C and a first peripheral mask pattern 38 in the peripheral circuit region P.

The first cell mask patterns 34 and the first peripheral mask pattern 38 may correspond to the second cell mask patterns 44 and the second peripheral mask pattern 48. The first cell mask patterns 34 and the second cell mask patterns 44 may define lower cell mask patterns 90 in the cell array region C.

Figure 6:
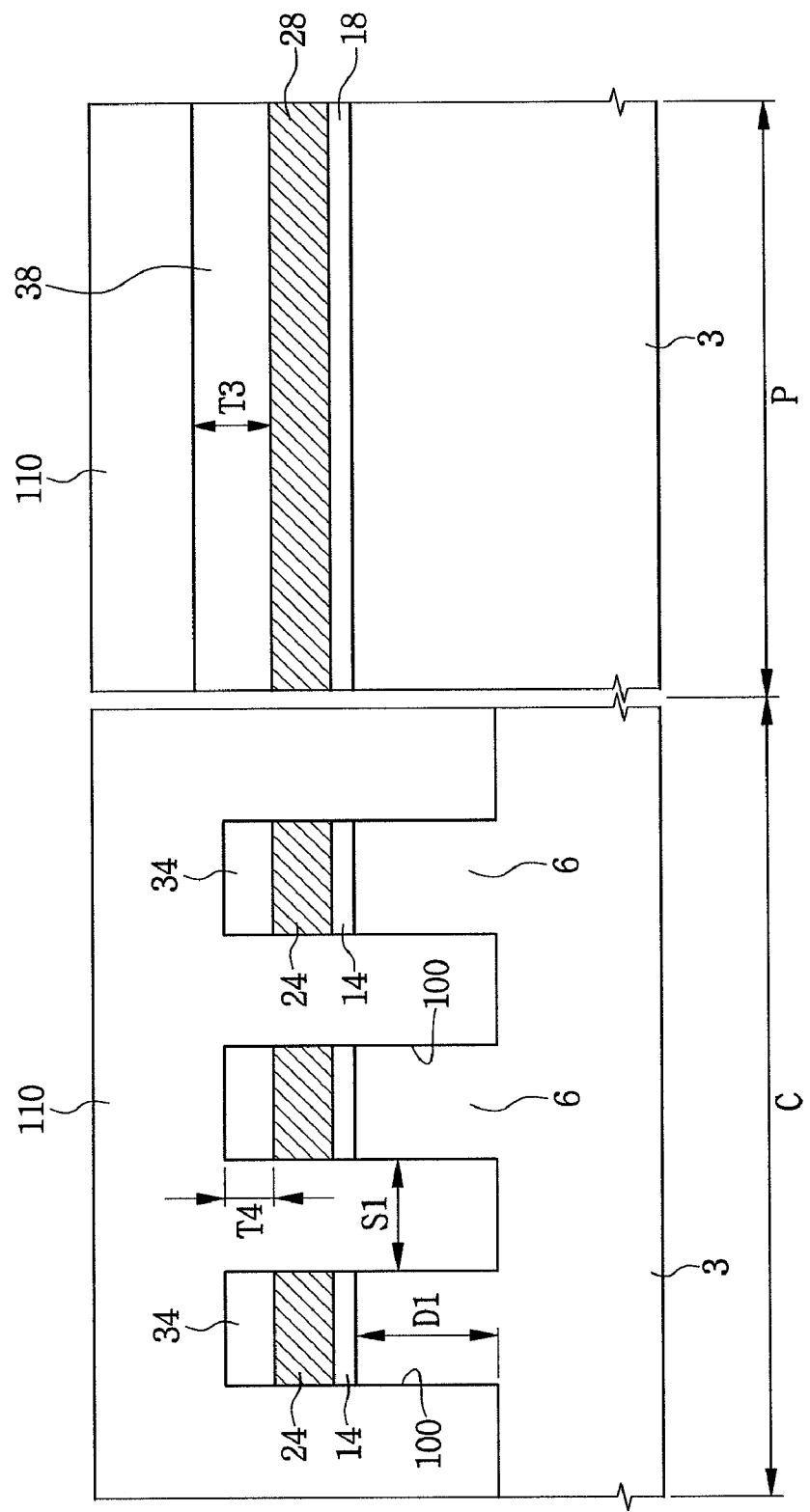

Referring to FIG. 6, using the lower cell mask patterns 90, the first peripheral mask pattern 38, and the second peripheral mask pattern 48 as an etch mask, the floating poly layer 20 in the cell array region C may be etched according to example embodiments. In this case, the second cell mask patterns 44 and the second peripheral mask pattern 48 may be removed from the semiconductor substrate 3. The floating poly layer 20 may be formed into cell floating poly patterns 24 in the cell array region C and a peripheral floating poly pattern 28 in the peripheral circuit region P.

The cell floating poly patterns 24 and the peripheral floating poly pattern 28 may correspond to the first cell mask patterns 34 and the first peripheral mask pattern 38. Subsequently, using the cell floating poly patterns 24, the peripheral floating poly pattern 28, the first cell mask patterns 34, and the first peripheral mask pattern 38 as an etch mask, the semiconductor substrate 3 and the tunnel oxide layer 10 in the cell array region C may be etched. The tunnel oxide layer 10 may be formed into cell tunnel oxide patterns 14 in the cell array region C and a peripheral tunnel oxide pattern 18 in the peripheral circuit region P.

The semiconductor substrate 3 may be etched to have cell trenches 100 between the cell tunnel oxide patterns 14. The cell trenches 100 may define the cell active regions 6. Each of the cell trenches 100 may be formed to have a predetermined depth D1 and a predetermined width S1. The width S1 of each of the cell trenches 100 may be the interval S1 between the cell active regions 6 of FIG. 1. After the cell trenches 100 are formed, a thickness T3 of the first peripheral mask pattern 38 may have a different value than a thickness T4 of the first cell mask patterns 34. Alternatively, the thickness T3 of the first peripheral mask pattern 38 may be substantially the same as the thickness T4 of the first cell mask patterns 34.

A first insulating layer 110 may be formed on the first cell mask patterns 34 and the first peripheral mask pattern 38 to cover the cell trenches 100. The first insulating layer 110 may include an insulating material having fluidity, e.g., a spin on dielectric (SOD) material.

Figure 7:
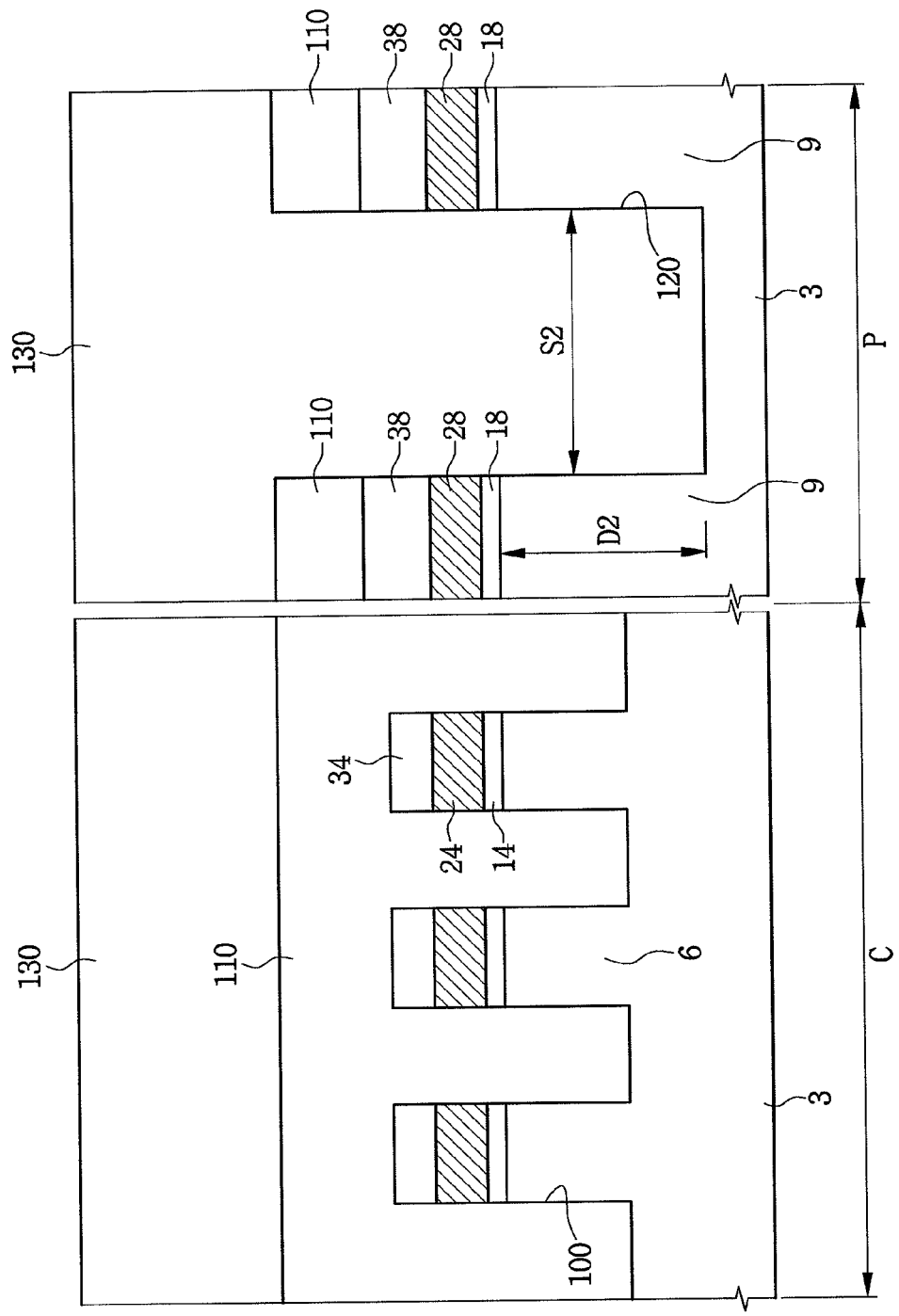

Referring to FIG. 7, a photoresist layer (not shown) may be formed on the first insulating layer 110 according to example embodiments. The photoresist layer may have at least one opening in the peripheral circuit region P. Using the photoresist layer as an etch mask, the semiconductor substrate 3, the peripheral tunnel oxide pattern 18, the peripheral floating poly pattern 28, the first peripheral mask pattern 38, and the first insulating layer 110 may be etched through the at least one opening of the photoresist layer. In this case, the semiconductor substrate 3 may have at least one peripheral trench 120 corresponding to the at least one opening of the photoresist layer in the peripheral circuit region P.

The at least one peripheral trench 120 may define the peripheral active regions 9. The at least one peripheral trench 120 may be formed to have a predetermined depth D2 and a predetermined width S2. The width S2 of the at least one peripheral trench 120 may be the distance S2 between the peripheral active regions 9 of FIG. 1. A light source of semiconductor photolithography equipment corresponding to the photoresist layer may have the same frequency as, or a different frequency than a light source of semiconductor photolithography equipment corresponding to the photoresist patterns of FIG. 3.

After the at least one peripheral trench 120 is formed, the photoresist layer may be removed from the semiconductor substrate 3. Subsequently, a second insulating layer 130 may be formed on the first insulating layer 110 to fill the at least one peripheral trench 120. The second insulating layer 130 may include insulating material having a higher mechanical strength than the first insulating layer 110. The second insulating layer 130 may be, e.g., a high density plasma (HDP) oxide layer or an undoped silicon glass (USG) oxide layer.

Figure 8:
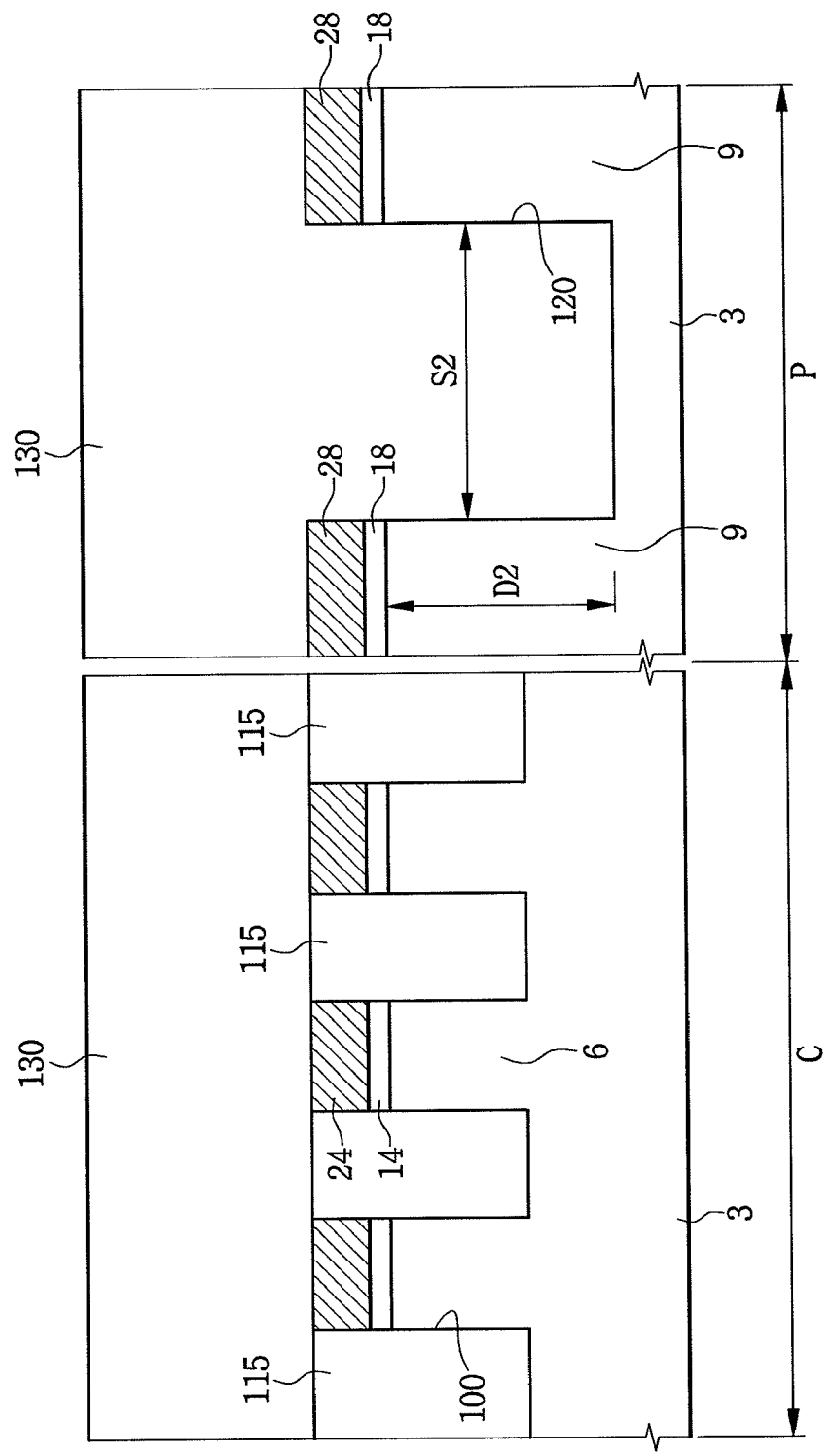
FIG. 8 illustrates a cross-sectional view along the lines I-I' and II-II' in FIG. 1 of a method of forming an active region structure according to another embodiment.

FIG. 8 illustrates a cross-sectional view along lines I-I' and II-II' of FIG. 1 of a method of forming an active region structure according to other example embodiments. FIG. 8 illustrates a stage following the stages described previously with reference to FIGS. 1-5.

Referring to FIG. 8, the first cell mask patterns 34, the first peripheral mask pattern 38, and the first insulating layer 110 of FIG. 6 may be etched according to example embodiments. In this case, as illustrated in FIG. 8, the cell trenches 100 may be filled with a cell device isolation layer 115 instead of the first insulation layer 110. The cell device isolation layer 115 may expose the cell floating poly patterns 24 and the peripheral floating poly pattern 28. A photoresist layer (not shown) may be formed on the cell floating poly patterns 24, the peripheral floating poly pattern 28, and the cell device isolation layer 115. The photoresist layer may have at least one opening in the peripheral circuit region P.

Using the photoresist layer as an etch mask, the semiconductor substrate 3, the peripheral tunnel oxide pattern 18, and the peripheral floating poly pattern 28 may be etched through the at least one opening of the photoresist layer. The semiconductor substrate 3 may have the at least one peripheral trench 120. The at least one peripheral trench 120 may define the peripheral active regions 9. The at least one peripheral trench 120 may be formed to have the predetermined depth D2 and the predetermined width S2.

The width S2 of the at least one peripheral trench 120 may be the distance S2 between the peripheral active regions 9 of FIG. 1. A light source of semiconductor photolithography equipment corresponding to the photoresist layer may have the same frequency as, or a different frequency than, a light source of semiconductor photolithography equipment corresponding to the photoresist patterns of FIG. 3. After the at least one peripheral trench 120 is formed, the photoresist layer may be removed from the semiconductor substrate 3. Subsequently, the second insulating layer 130 may be formed on the cell floating poly patterns 24, the peripheral floating poly pattern 28, and the cell device isolation layer 115 to fill the at least one peripheral trench 120.

Figure 9:
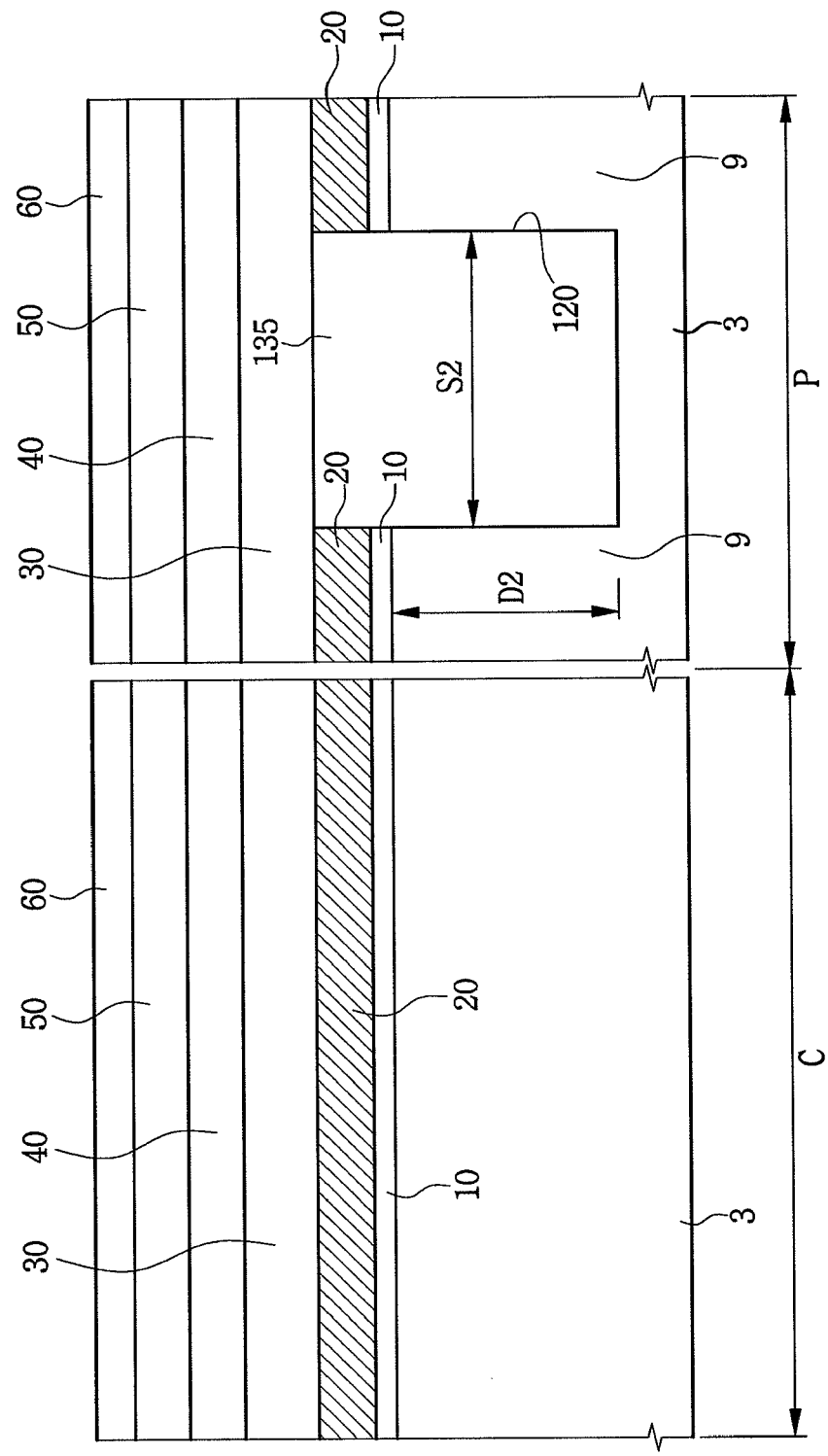
FIGS. 9 and 10 illustrate a cross-sectional view along the lines I-I' and II-II' in FIG. 1 of a method of forming an active region structure according to another embodiment.
Figure 10:
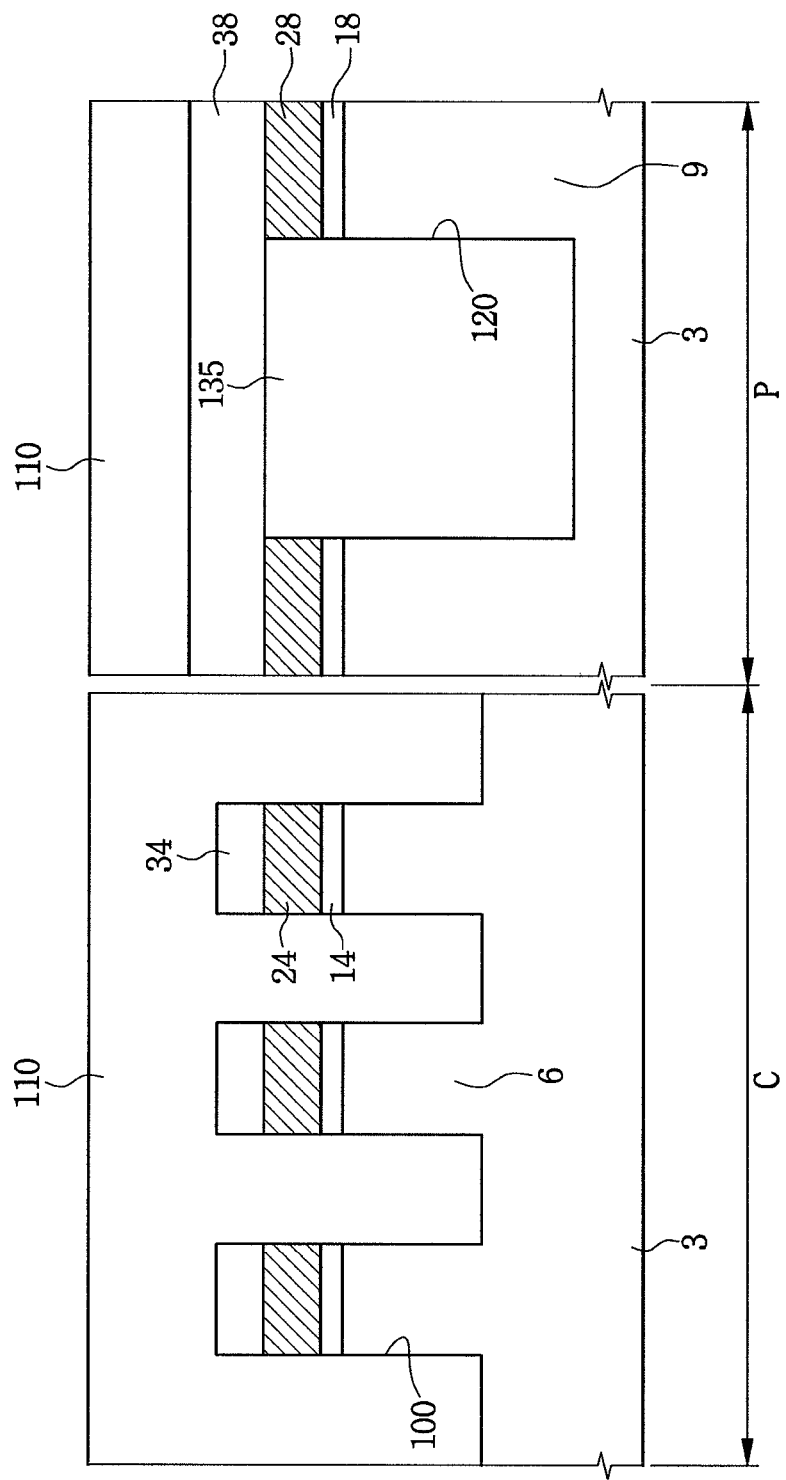

FIGS. 9 and 10 illustrate cross-sectional views along lines I-I' and II-II' in FIG. 1 of a method of forming an active region structure according to another example embodiment. FIGS. 9-10 illustrate stages following formation of the floating poly layer 20 in FIG. 2 described previously.

Referring to FIG. 9, a photoresist layer (not shown) may be formed on the floating poly layer 20 of FIG. 2 according to example embodiments. The photoresist layer may have at least one opening in the peripheral circuit region P. Using the photoresist layer as an etch mask, the semiconductor substrate 3, the tunnel oxide layer 10, and the floating poly layer 20 may be etched through the at least one opening of the photoresist layer to form the at least one peripheral trench 120 in the peripheral circuit region P of the substrate 3. The at least one peripheral trench 120 corresponds to the at least one opening.

The at least one peripheral trench 120 may define the peripheral active regions 9. The at least one peripheral trench 120 may be formed to have the predetermined depth D2 and the predetermined width S2. The width S2 of the at least one peripheral trench 120 may be the distance S2 between the peripheral active regions 9 of FIG. 1. A light source of semiconductor photolithography equipment corresponding to the photoresist layer may have the same frequency as, or a different frequency than, a light source of semiconductor photolithography equipment corresponding to the photoresist patterns of FIG. 3.

After the at least one peripheral trench 120 is formed, the photoresist layer may be removed from the semiconductor substrate 3. Subsequently, the second insulating layer 130 may be formed on the floating poly layer 20 to fill the at least one peripheral trench 120. By etching the second insulating layer 130 to expose the floating poly layer 20, a peripheral device isolation layer 135 may be formed in the at least one peripheral trench 120. After the peripheral device isolation layer 135 is formed, the first to fourth mask layers 30, 40, 50 and 60 of may be formed in sequence, as described previously with reference to FIG. 2.

Referring to FIG. 10, the processes of FIGS. 3 to 5 may be performed on the first to fourth mask layers 30, 40, 50, and 60, as described previously. Through the performance of the processes, the lower cell mask patterns 90, the first peripheral mask pattern 38, and the second peripheral mask pattern 48 may be formed on the floating poly layer 20, as described previously with reference to FIG. 5. The lower cell mask patterns 90 may include the first cell mask patterns 34 and the second cell mask patterns 44. Subsequently, the process of FIG. 6 may be performed on the lower cell mask patterns 90, the first peripheral mask pattern 38, and the second peripheral mask pattern 48.

Figure 11:
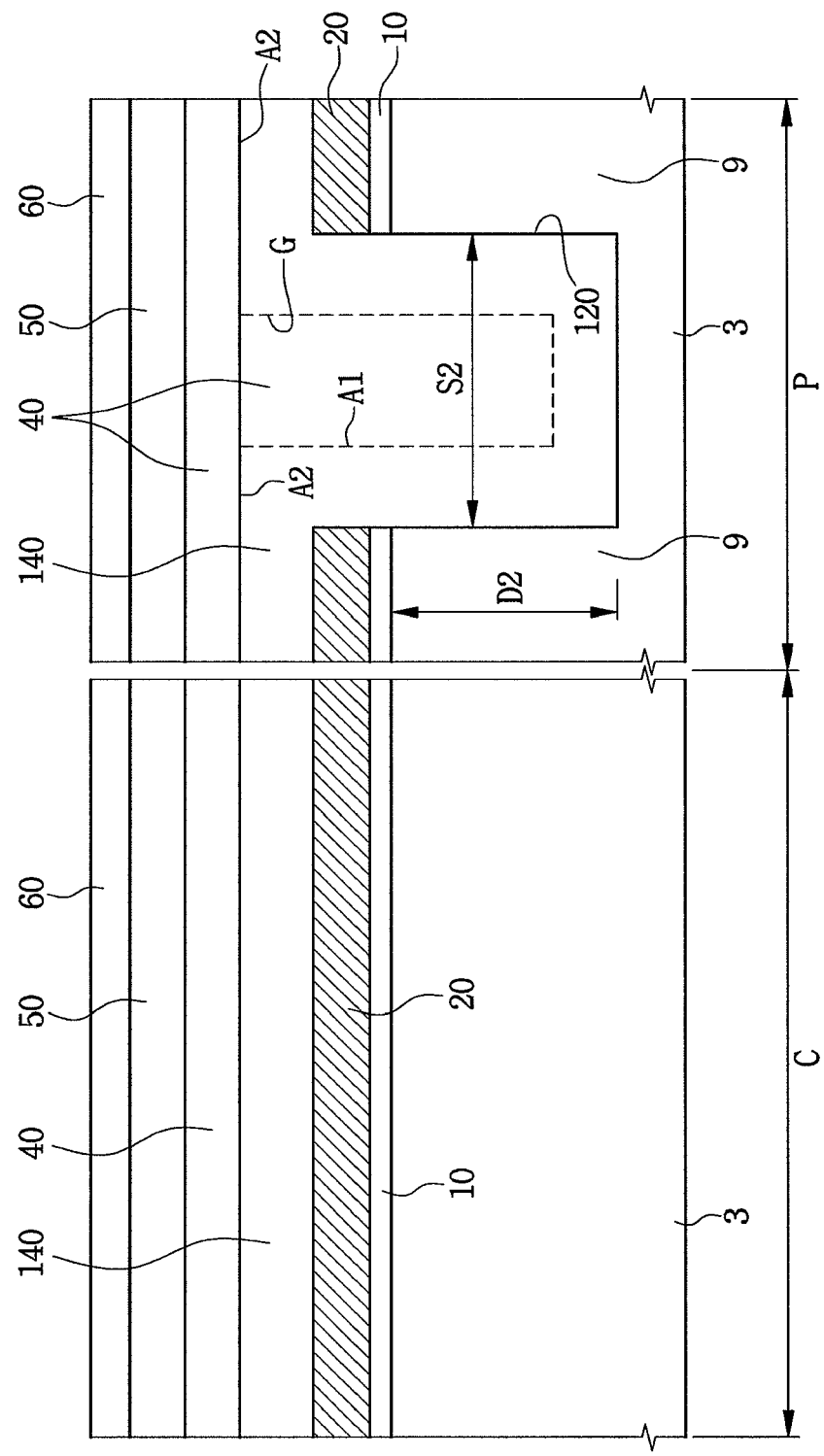
FIGS. 11 and 12 illustrate a cross-sectional view along the lines I-I' and II-II' in FIG. 1 of a method of forming an active region structure according to another embodiment.
Figure 12:
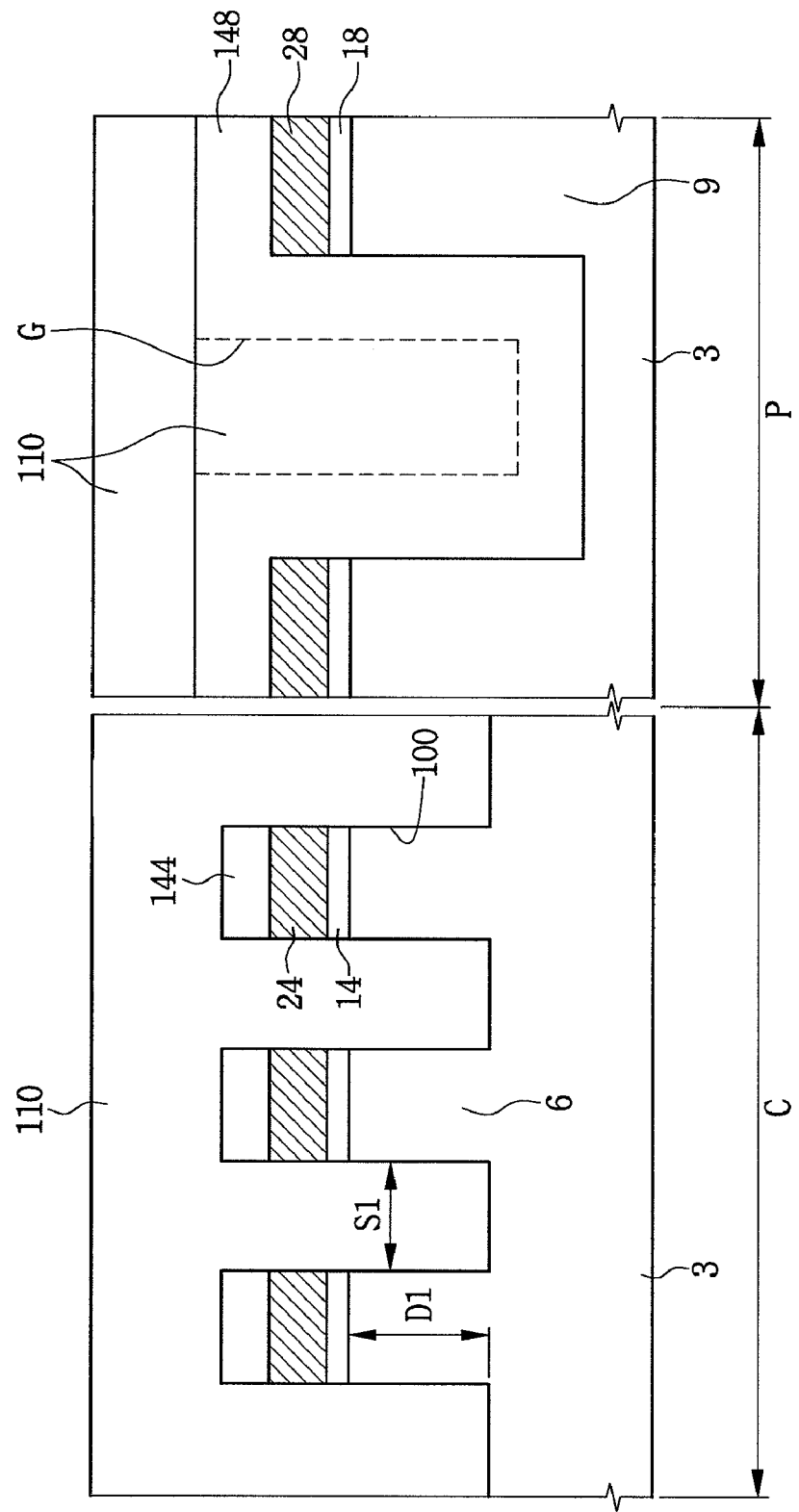

FIGS. 11 and 12 illustrate cross-sectional views along lines I-I' and II-II' in FIG. 1 of a method of forming an active region structure according to another example embodiment. FIGS. 11-12 illustrate stages following removal of the photoresist layer of FIG. 9.

Referring to FIG. 11, a molding layer 140 may be formed on the floating poly layer 20 to fill the at least one peripheral trench 120, instead of the peripheral device isolation layer 135 of FIG. 9. The molding layer 140 may be formed in the cell array region C and the peripheral circuit region P. For example, the molding layer 140 may conformally cover or fill the at least one peripheral trench 120. When the molding layer 140 has the conformal shape in the at least one peripheral trench 120, the molding layer 140 may include a concavity G defining upper surfaces A1 and A2.

The second to fourth mask layers 40, 50 and 60 may be formed on the molding layer 140 in sequence, as described previously with reference to FIG. 2. The second mask layer 40 may fill the concavity G of the molding layer 140 and/or may be formed on the upper surface A2 of the molding layer 140.

Referring to FIG. 12, the processes of FIGS. 3 to 6 may be performed on the molding layer 140 and the second to fourth mask layers 40, 50, and 60. In this case, as illustrated in FIG. 12, the cell active regions 6 of FIG. 6 may have cell molding patterns 144 thereon. The peripheral active regions 9 of FIG. 6 may have peripheral molding pattern 148 thereon as shown in FIG. 12. The cell molding patterns 144 and the peripheral molding pattern 148 may be formed not to have the second cell mask patterns 44 and the second peripheral mask pattern 48 of FIG. 5 thereon.

The peripheral molding pattern 148 may or may not have the concavity G in the at least one peripheral trench 120, e.g., the concavity G may or may not be filled with the second mask layer 40. When the peripheral molding pattern 148 has the concavity G, the first insulating layer 110 of FIG. 6 may be formed on the cell molding patterns 144 and the peripheral molding pattern 148 to fill the cell trenches 100 and the concavity G of the peripheral molding pattern 148. When the peripheral molding pattern 148 does not have the concavity G, the first insulating layer 110 may be formed on the cell molding patterns 144 and the peripheral molding pattern 148 to fill the cell trenches 100.

Figure 13:
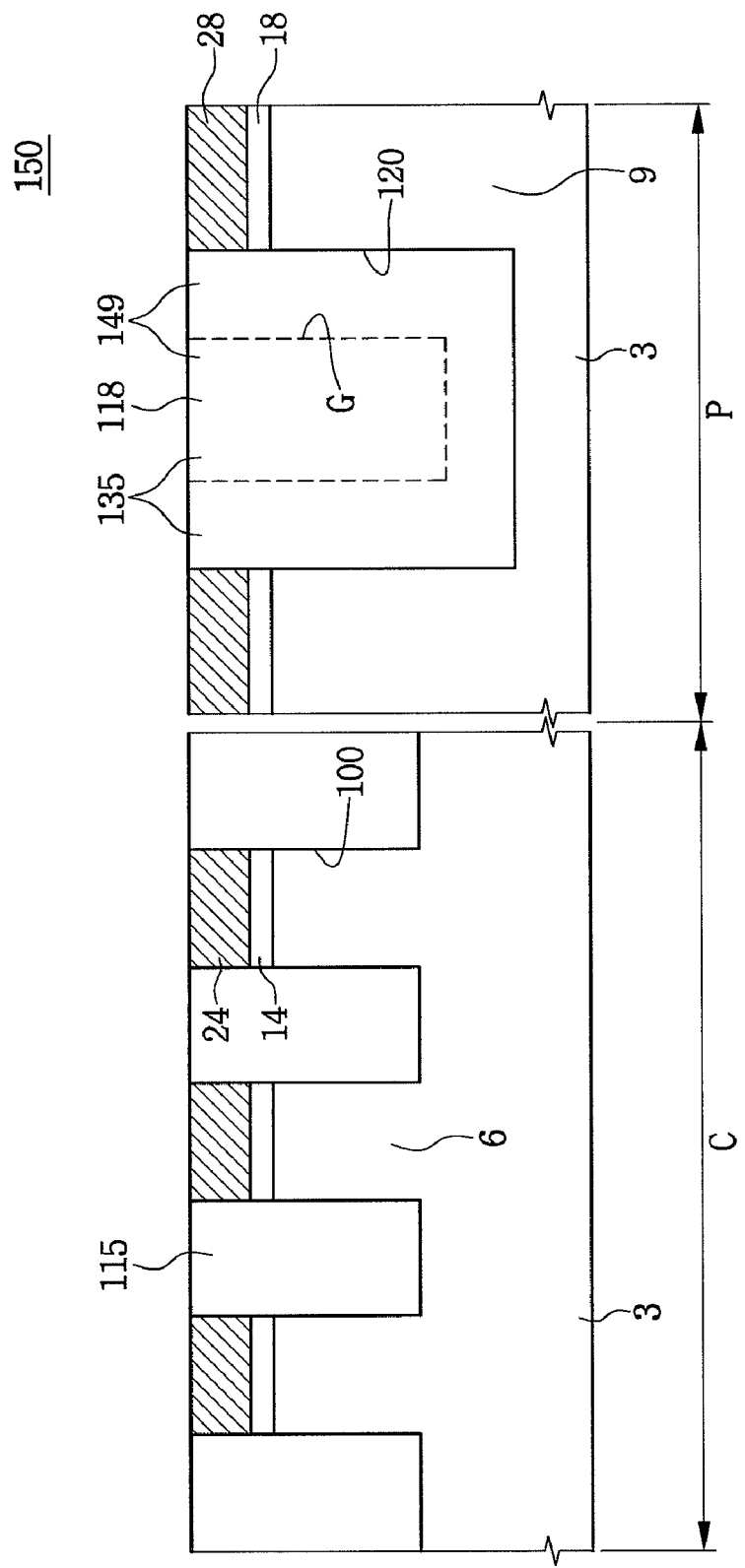
FIG. 13 illustrates a cross-sectional view along the lines I-I' and II-II' in FIG. 1 of a method of forming an active region structure according to another embodiment.

FIG. 13 illustrates a cross-sectional view along lines I-I' and II-II' in FIG. 1 of a method of forming an active region structure according to another example embodiment. FIG. 13 illustrates a stage following the processes of FIG. 7, 8, 10 or 12.

Referring to FIG. 13, the cell floating poly patterns 24 and the peripheral floating poly pattern 28 may be exposed by etching the first cell mask patterns 34, the first peripheral mask pattern 38, the first insulating layer 110, and the second insulating layer 130 of FIG. 7. In this case, as illustrated in FIG. 13, the first insulating layer 110 may be formed into the cell device isolation layer 115 that fills the cell trenches 100 in the cell array region C. The second insulating layer 130 may be formed into the peripheral device isolation layer 135 that fills the at least one peripheral trench 120 in the peripheral circuit region P.

According to example embodiments, the cell floating poly patterns 24, the peripheral floating poly pattern 28, and the cell device isolation layer 115 may be exposed by etching the second insulating layer 130 of FIG. 8. In this case, the second insulating layer 130 may be formed into the peripheral device isolation layer 135 of FIG. 13 that fills the at least one peripheral trench 120 in the peripheral circuit region P.

According to example embodiments, the cell floating poly patterns 24, the peripheral floating poly pattern 28, and the peripheral device isolation layer 135 may be exposed by etching the first cell mask patterns 34, the first peripheral mask pattern 38, and the first insulating layer 110 of FIG. 10. In this case, the first insulating layer 110 may be formed into the cell device isolation layer 115 of FIG. 13 that fills the cell trenches 100 in the cell array region C.

According to example embodiments, the cell floating poly patterns 24 and the peripheral floating poly pattern 28 may be exposed by etching the cell molding patterns 144, the peripheral molding pattern 148, and the first insulating layer 110 of FIG. 12. The first insulating layer 110 may be formed into the cell device isolation layer 115 of FIG. 13 that fills the cell trenches 100 in the cell array region C. When the peripheral molding pattern 148 has the concavity G, the peripheral molding pattern 148 and the first insulating layer 110 may be formed into the peripheral device isolation layer 135 of FIG. 13 that fills the at least one peripheral trench 120 in the peripheral circuit region P.

The peripheral device isolation layer may include a filling pattern 118 and a molding pattern 149. When the peripheral molding pattern 148 does not have the concavity G, the peripheral molding pattern 148 may be formed into the peripheral device isolation layer 149 of FIG. 13 that fills the at least one peripheral trench 120 in the peripheral circuit region P. The peripheral device isolation layer 135 may be formed by sufficiently filling the at least one peripheral trench 120 with the molding pattern 149 alone.

According to example embodiments, the cell device isolation layer 115 and the peripheral device isolation layer 135, 118 and 149, or 149 of FIG. 7, 8, 10 or 12 may constitute the active region structure 150 together with the cell and peripheral active regions 6 and 9.

As described above, example embodiments provide a method of forming an active region structure in which cell trenches in a cell array region of a semiconductor substrate are formed through a different process than at least one peripheral trench in a peripheral circuit region. Thus, example embodiments can overcome the limit of a semiconductor photolithography process and/or of the semiconductor etching process. As a result, the cell trenches and the at least one peripheral trench can stably define cell active regions and a peripheral trench in the semiconductor substrate by positively coping with a reduction in the design rule of semiconductor devices.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of exemplary embodiments as set forth in the following claims.

What is claimed is:

1. A method of forming an active region structure, comprising:
    preparing a semiconductor substrate having a cell array region and a peripheral circuit region;
    forming upper cell mask patterns having a line shape in the cell array region;
    forming first and second peripheral mask patterns in the peripheral circuit region, the first and second peripheral mask patterns being stacked in sequence and covering the peripheral circuit region, and upper surfaces of the upper cell mask patterns forming a step difference with an upper surface of the second peripheral mask pattern;
    forming spacers on sidewalls of the upper cell mask patterns to expose lower portions of the upper cell mask patterns and the second peripheral mask pattern; and
    removing the lower portions of the upper cell mask patterns using the spacers and the first and second peripheral mask patterns as an etch mask,
    wherein forming the upper cell mask patterns and the first and second peripheral mask patterns includes:
        sequentially forming an upper mask layer of a stacked material and photoresist patterns on the semiconductor substrate, such that photoresist patterns in the cell array region expose the upper mask layer in the cell array region, and a photoresist pattern in the peripheral circuit region covers the upper mask layer in the peripheral circuit region,
        etching an upper portion of the upper mask layer using the photoresist patterns as an etch mask,
        removing the photoresist patterns from the semiconductor substrate, and
        etching a lower portion of the upper mask layer in the cell array region using the upper portion of the upper mask layer in the cell array region and the upper mask layer in the peripheral circuit region as an etch mask, and wherein the upper mask layer is formed into the upper cell mask patterns in the cell array region and the first and second peripheral mask patterns in the peripheral circuit region, the upper surfaces of the upper cell mask patterns having a lower level than the upper surface of the second peripheral mask pattern due to an etch loading effect of an etching gas after the photoresist patterns are removed.

2. The method as claimed by claim 1, wherein forming the spacers includes:

forming a spacer layer on the upper cell mask patterns and the first and second peripheral mask patterns; and etching the spacer layer and the upper portions of the upper cell mask patterns using the second peripheral mask pattern as an etch buffer layer.

3. The method as claimed by claim 2, further comprising:

forming a lower mask layer between the semiconductor substrate and the upper mask layer;

partially etching the lower mask layer in the cell array region using the spacers and the first and second peripheral mask patterns as an etch mask, such that the second peripheral mask pattern is removed from the semiconductor substrate, the lower mask layer is formed of a stacked material, and an upper portion of the lower mask layer in the cell array region has a line shape corresponding to the spacers;

removing the first peripheral mask pattern using the spacers and the lower mask layer as an etch buffer layer; and etching a lower portion of the lower mask layer in the cell array region using the spacers, the upper portion of the lower mask layer in the cell array region, and the lower mask layer in the peripheral circuit region as an etch mask, wherein the lower mask layer is formed into lower cell mask patterns in the cell array region through the spacers, and third and fourth peripheral mask patterns stacked in sequence in the peripheral circuit region, and the spacers are removed from the semiconductor substrate after the lower cell mask patterns and the third and fourth peripheral mask patterns are formed.

4. The method as claimed by claim 3, further comprising:

sequentially forming a tunnel oxide layer and a floating poly layer between the semiconductor substrate and the lower mask layer;

etching the floating poly layer in the cell array region using the lower cell mask patterns and the third and fourth peripheral mask patterns as an etch mask, upper portions of the lower cell mask patterns and the fourth peripheral mask pattern being removed from the semiconductor substrate, and the floating poly layer being formed into cell floating poly patterns in the cell array region and a peripheral floating poly pattern in the peripheral circuit region; and etching the tunnel oxide layer and the semiconductor substrate in the cell array region using lower portions of the lower cell mask patterns, the cell floating poly patterns, the third peripheral mask pattern, and the peripheral floating poly pattern as an etch mask to form cell trenches in the cell array region, wherein after the cell trenches are formed, the tunnel oxide layer is formed into cell tunnel oxide patterns in the cell array region and a peripheral tunnel oxide pattern in the peripheral circuit region.

5. The method as claimed by claim 4, further comprising:

forming a first insulating layer on the lower portions of the lower cell mask patterns and the third peripheral mask pattern to fill the cell trenches;

etching the semiconductor substrate, the peripheral tunnel oxide pattern, the peripheral floating poly pattern, the third peripheral mask pattern, and the first insulating layer in the peripheral circuit region to form at least one cell trench in the peripheral circuit region; and forming a second insulating layer on the first insulating layer to fill the at least one peripheral trench, wherein the first insulating layer includes an insulating material exhibiting fluidity, and the second insulating layer includes an insulating material exhibiting a higher mechanical strength than the first insulating layer.

6. The method as claimed by claim 5, wherein forming the at least one peripheral trench includes:

forming a photoresist layer on the first insulating layer, the photoresist layer having at least one opening in the peripheral circuit region; and etching the semiconductor substrate, the peripheral tunnel oxide pattern, the peripheral floating poly pattern, the third peripheral mask pattern, and the first insulating layer in the peripheral circuit region through the at least one opening of the photoresist layer, wherein a light source of a semiconductor photolithography equipment corresponding to the photoresist layer has a same frequency as a light source of a semiconductor photolithography equipment corresponding to the photoresist patterns or a different frequency.

7. The method as claimed by claim 4, further comprising:

forming a first insulating layer on the lower portions of the lower cell mask patterns to fill the cell trenches, and on the third peripheral mask pattern;

etching the first insulating layer, the lower portions of the lower cell mask patterns, and the third peripheral mask pattern to expose the cell floating poly patterns and the peripheral floating poly pattern, and forming a cell device isolation layer in the cell trenches;

forming at least one peripheral trench in the peripheral circuit region by etching the semiconductor substrate, the peripheral tunnel oxide pattern, and the peripheral floating poly pattern in the peripheral circuit region; and forming a second insulating layer on the cell device isolation layer, the cell floating poly patterns, and the peripheral floating poly pattern to fill the at least one peripheral trench, wherein the first insulating layer includes an insulating material exhibiting fluidity, and the second insulating layer includes an insulating material exhibiting a higher mechanical strength than the first insulating layer.

8. The method as claimed by claim 7, wherein forming the at least one peripheral trench includes:

forming a photoresist layer on the cell device isolation layer, the cell floating poly patterns, and the peripheral floating poly pattern, the photoresist layer having at least one opening in the peripheral circuit region; and etching the semiconductor substrate, the peripheral tunnel oxide pattern, and the peripheral floating poly pattern in the peripheral circuit region through the at least one opening of the photoresist layer, wherein a light source of a semiconductor photolithography equipment corresponding to the photoresist layer has a same frequency as a light source of a semiconductor photolithography equipment corresponding to the photoresist patterns or a different frequency.

9. The method as claimed by claim 3, wherein the lower mask layer includes silicon dioxide ($SiO_2$) in the lower portion and polysilicon in the upper portion, and the upper mask layer includes polymer in the lower portion and anti-reflective coating (ARC) material in the upper portion.

* * * * *